US006797632B1

(12) United States Patent
Nakano et al.

(10) Patent No.: US 6,797,632 B1
(45) Date of Patent: Sep. 28, 2004

(54) BONDED WAFER PRODUCING METHOD AND BONDED WAFER

(75) Inventors: Masatake Nakano, Annaka (JP); Kiyoshi Mitani, Annaka (JP); Shinichi Tomizawa, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 281 days.

(21) Appl. No.: 09/857,569

(22) PCT Filed: Sep. 29, 2000

(86) PCT No.: PCT/JP00/06795

§ 371 (c)(1),
(2), (4) Date: Jun. 7, 2001

(87) PCT Pub. No.: WO01/27999

PCT Pub. Date: Apr. 19, 2001

(30) Foreign Application Priority Data

Oct. 14, 1999 (JP) .......................... 11-292130

(51) Int. Cl.$^7$ .............................. H01I 21/302
(52) U.S. Cl. ................... 438/704; 438/149; 438/164; 438/692; 438/734; 438/750; 216/88
(58) Field of Search ................. 438/692, 693, 438/704, 750, 734, 164, 149, 753, 756, 714, 723, 719; 216/88, 89

(56) References Cited

U.S. PATENT DOCUMENTS

| 5,494,849 | A | | 2/1996 | Iyer et al. | |
|---|---|---|---|---|---|
| 6,265,328 | B1 | * | 7/2001 | Henley et al. | 438/782 |
| 6,417,108 | B1 | * | 7/2002 | Akino et al. | 438/690 |

FOREIGN PATENT DOCUMENTS

| EP | 0 451 993 A2 | 10/1991 |
|---|---|---|
| JP | A 3-87012 | 4/1991 |
| JP | A 3-250616 | 11/1991 |
| JP | B2 5-46086 | 7/1993 |
| JP | A 5-211128 | 8/1993 |
| JP | A 8-97111 | 4/1996 |
| JP | A 9-64321 | 3/1997 |
| JP | A 10-270298 | 10/1998 |
| JP | A 11-026336 | 1/1999 |

OTHER PUBLICATIONS

K. Mitani. "Smart Cut (R) SOI Gijutsu no Shinchoku To Doukou". Cho LSI Ultra Clean Technology Symposium. vol. 33 Japan. UCS Handotai Kiban Gijutsu Kenkyukai. (May 27, 1999). pp. 119–126.

M. Bruel et al., "Smart–Cut: A New Silicon On Insulator Material Technology Based on Hydrogen Implantation and Wafer Bonding", Jpn. J. Appl. Phys., vol. 36, 1997, pp 1636–1641.

* cited by examiner

Primary Examiner—George A. Goudreau
(74) Attorney, Agent, or Firm—Oliff & Berridge, PLC

(57) ABSTRACT

In a method for producing a bonding wafer by the hydrogen ion delamination method comprising at least a step of bonding a base wafer and a bond wafer having a micro bubble layer formed by gas ion implantation and a step of delaminating them at the micro bubble layer as a border, a peripheral portion of a thin film formed on the base wafer is removed after the delamination step. Preferably, a region of 1–5 mm from the peripheral end of the base wafer is removed. In the production of a bonding wafer by the hydrogen ion delamination method, there can be provided a bonding wafer free from problems such as generation of particles from peripheral portion of the wafer and generation of cracks in the SOI layer.

6 Claims, 5 Drawing Sheets

BONDED WAFER PRODUCING METHOD AND BONDED WAFER

TECHNICAL FIELD

The present invention relates to a method for producing a bonding wafer by the so-called hydrogen ion delamination method (also called a smart cut method) comprising bonding an ion-implanted wafer to another wafer that serves as a substrate and then delaminating the wafers, which method can reduce failures to be generated in a peripheral portion of the wafer after the delamination.

BACKGROUND ART

As a method for producing an SOI (Silicon On Insulator) wafer using the so-called bonding method, there is known a technique comprising bonding two of silicon wafers via a silicon oxide film, for example, a method comprising forming an oxide film on at least one of such wafers, bonding the wafers to each other without interposing foreign matters between the surfaces to be bonded, and then subjecting them to a heat treatment at a temperature of 200–1200° C. to enhance the bonding strength, as disclosed in Japanese Patent Publication (Kokoku) No. 5-46086.

The bonding wafer, of which bonding strength was enhanced by such a heat treatment, can be subjected to subsequent grinding and polishing processes. Therefore, an SOI layer for fabricating elements can be formed by reducing thickness of the wafer on which elements are to be fabricated (bond wafer) to a desired thickness by grinding and polishing.

A bonding SOI wafer produced as described above has advantages of superior crystallinity of SOI layer and high reliability of buried oxide layer existing directly under the SOI layer. However, because it is produced through reduction of thickness by grinding and polishing, the reduction of thickness takes a lot of time and generates waste of the material. In addition, obtainable uniformity of the thickness is only in such a degree of target thickness ±0.3 μm at most.

Further, since there are portions called polishing sag at the peripheral portions of two mirror-surface wafers to be bonded, the portions cannot be bonded and they are left as unbonded portions. If the thickness reduction is performed with existence of such unbonded portions, failures such as delamination of the unbonded portions may be caused during the thickness reduction process. Therefore, these unbonded portions must be removed beforehand (see, for example, Japanese Patent Laid-open (Kokai) Publication No. 3-250616).

Meanwhile, in connection with recent use of higher integration degree and higher processing velocity of semiconductor devices, further reduction to thin film thickness and improvement of film thickness uniformity are required as for the thickness of the SOI layer. Specifically, a film thickness and uniformity represented as 0.1±0.01 μm or so are required.

Because a thin film SOI wafer having such a film thickness and film thickness uniformity cannot be realized from a bonding wafer by the conventional thickness reduction processing through grinding and polishing, the method called hydrogen ion delamination method was developed as a novel film thickness reduction technique as disclosed in Japanese Patent Laid-open (Kokai) Publication No. 5-211128.

This hydrogen ion delamination method is a technique for producing an SOI wafer, wherein an oxide film is formed on at least one of two silicon wafers, hydrogen ions or rare gas ions are implanted into one wafer (also referred to as bond wafer hereinafter) from its top surface to form a micro bubble layer (enclosed layer) in this silicon wafer, then the ion-implanted surface of the wafer is bonded to the other wafer (also referred to as base wafer hereinafter) via the oxide layer, thereafter the bond wafer is delaminated at the micro bubble layer as a cleavage plane (delaminating plane) by a heat treatment (delamination heat treatment), and the base wafer on which a silicon layer is formed as a thin film (SOI layer) is further subjected to a heat treatment (bonding heat treatment) to strengthen the bonding to obtain an SOI wafer.

In this hydrogen ion delamination method, it is also possible to directly bond silicon wafers to each other without an oxide film after the ion implantation, and it can be used not only for a case where silicon wafers are bonded to each other, but also for a case where an ion-implanted silicon wafer is bonded to an insulator wafer having a different thermal expansion coefficient such as those of quartz, silicon carbide, alumina and so forth.

By using the hydrogen ion delamination method, the delaminated plane can be obtained as a good mirror surface. Therefore, for example, when an SOI wafer is produced, an SOI wafer having an extremely high uniformity of the SOI layer can be relatively easily obtained. In addition, since the bond wafer after the delamination (also called delaminated wafer hereinafter) can be recycled, the method enjoys an advantage that the material can be used effectively.

Further, since the unbonded peripheral portions are left on the delaminated wafer upon the delamination, it also has an advantage that such a process of removing the unbonded portions of peripheral portions of wafers as disclosed in the aforementioned Japanese Patent Laid-open (Kokai) Publication No. 3-250610 becomes unnecessary. This is one of the important advantages of the hydrogen ion delamination method including the obtainable film thickness uniformity of SOI layer and the possibility of recycling of the material.

By actually observing a peripheral portion of SOI wafer produced by the hydrogen ion delamination method, it can be seen that the peripheral end of the SOI layer locates in a inside region of about 1 mm from the peripheral end of the base wafer. This is because portions of about 1 mm from the peripheral ends of the bonded two wafers are not bonded due to the polishing sag of the peripheral portions thereof and hence delaminated.

The width of the unbonded portions from the peripheral ends depends on size of the polishing sag, and it is known that it is usually about 1 mm or about 2 mm at most when a usual mirror polished silicon wafer is used.

However, it has become clear that, if an SOI wafer produced by the hydrogen ion delamination method as described above is subjected to various processes such as heat treatment, cleaning and device production, problems may occur including generation of particles from peripheral portion of the wafer, generation of cracks in the SOI layer and so forth, although occurring frequency is not so high. Because generation of such particles, cracks and so forth may cause reduction of yield or degradation of characteristics in the device production process using SOI wafers, it must be avoided as much as possible.

The cause of the aforementioned generation of particles, cracks and so on is considered as follows. That is, peripheral portions of a bonding wafer produced by the hydrogen ion delamination method do not have unbonded portions and they are physically bonded. However, their bonding strength is not necessarily sufficient compared with the wafer center portions due to the sag in the wafer pheripheral portions generated before the bonding. It is considered that, therefore, particles are generated or cracks are formed in the SOI layer from such wafer peripheral portions having insufficient bonding strength during the various heat treatment processes, cleaning process, device production process and so forth after the delamination.

Such a problem is not limited to SOI wafers formed by bonding silicon wafers to each other via an oxide film, but commonly observed in all bonding wafers produced by the hydrogen ion delamination method, for example, the aforementioned SOI wafers utilizing insulator wafers such as those of quartz, silicon carbide, alumina and so forth as the base wafer, or bonding wafers formed by directly bonding silicon wafers without an oxide film.

DISCLOSURE OF THE INVENTION

In view of the above problems, an object of the present invention is, when producing a bonding wafer by the hydrogen ion delamination method, to produce a bonding wafer free from the problems of the generation of particles from the peripheral portion of the wafer and the generation of cracks in the SOI layer and so forth.

In order to achieve the aforementioned object, the present invention provides a method for producing a bonding wafer by the hydrogen ion delamination method comprising at least a step of bonding a base wafer and a bond wafer having a micro bubble layer formed by gas ion implantation and a step of delaminating them at the micro bubble layer as a border, wherein a peripheral portion of a thin film formed on the base wafer is removed after the delamination step.

By removing a peripheral portion having insufficient bonding strength of the thin film formed on the base wafer after the delamination step in a method for producing a bonding wafer by the hydrogen ion delamination method as described above, a bonding wafer having sufficient bonding strength over the whole bonded area can be provided, and thus the problems in a device production process and the like, which are the generation of particles from the peripheral portion of the thin film, the generation of cracks in the thin film and so forth, can be prevented.

The present invention further provides the aforementioned method for producing a bonding wafer in which the thin film has at least an SOI layer.

When the wafer is a bonding SOI wafer in which the thin film formed on the base wafer consists of an SOI layer, or an SOI layer and an insulating film such as an oxide film, at least a peripheral portion of the SOI layer formed on the base wafer can be removed after the delamination step to provide an SOI wafer free from the generation of particles from the peripheral portion of the wafer and the generation of cracks in the SOI layer.

When the peripheral portion of the thin film is removed as described above, it is preferable to remove a region of 1–5 mm from the peripheral end of the base wafer.

Further, when the wafer is a bonding SOI wafer in which the thin film formed on the base wafer has at least an SOI layer, the removal of the peripheral portion of the thin film is preferably attained by removing at least the SOI layer for a region of 1–5 mm from the peripheral end of the base wafer.

Since the portion showing insufficient bonding strength with respect to the base wafer in the thin film usually exists in such a region, the portion having insufficient bonding strength can be surely removed by forcibly removing that portion of the peripheral portion of the thin film, and thus a bonding wafer in which the whole thin film is firmly bonded to the base wafer can be obtained.

The removal of the peripheral portion of the thin film can be attained by etching the wafer with masking at least portions of the top surface other than the peripheral portion to be removed.

By performing the etching in such a manner as described above, the peripheral portion of the thin film can be easily and surely removed.

Further, as another method, the peripheral portion of the thin film can also be removed by holding together a plurality of wafers stacked so that at least the peripheral portions to be removed should be exposed, and etching them. By such a method, many wafers can be etched simultaneously, and hence the peripheral portion of the thin film can be removed efficiently.

Furthermore, the removal of the peripheral portion of the thin film can be attained by polishing only the peripheral portion. The peripheral portion of the thin film can also be easily and surely removed by such polishing of only the peripheral portion.

The present invention further provides a bonding wafer produced by the hydrogen ion delamination method, wherein a thin film formed on a base wafer is removed for a region of 1–5 mm from a peripheral end of the base wafer.

Such a bonding wafer can be produced by the aforementioned production method of the present invention, and is free from the problems of the generation of particles from the peripheral portion of the wafer, the generation of cracks in the thin film and so forth.

The present invention also provides the aforementioned bonding wafer, wherein the thin film has an SOI layer and at least the SOI layer is removed for a region of 1–5 mm from the peripheral end of the base wafer.

Such a bonding SOI wafer in which the peripheral portion of the SOI layer is removed for a region of the range from the peripheral end of the base wafer defined above has a film thickness and film thickness uniformity suitable for recent semiconductor devices of high integration degree and high processing velocity. In addition, since the SOI layer is bonded to the base wafer with sufficient bonding strength over the whole wafer, the problems of the generation of particles from the peripheral portion of the wafer and the generation of cracks in the SOI layer during the device production process and so forth are substantially avoided.

As explained above, according to the present invention, when a bonding wafer is produced by the hydrogen ion delamination method, a peripheral portion of thin film such as SOI layer formed on the base wafer is removed after the delamination step, and thereby a region of insufficient bonding strength can be eliminated and there can be provided a bonding wafer having sufficient bonding strength for the whole wafer.

Such a bonding wafer does not substantially generate particles from the peripheral portion of the thin film and so forth or does not generate cracks in the thin film during subsequent cleaning process, device production process or the like. Therefore, it has advantages of marked reduction of characteristics degradation and improvement of yield.

BEST MODE FOR CARRYING OUT THE INVENTION

Hereafter, embodiments of the present invention will be explained with reference to the appended drawings. However, the present invention is not limited to these.

Figure 1:
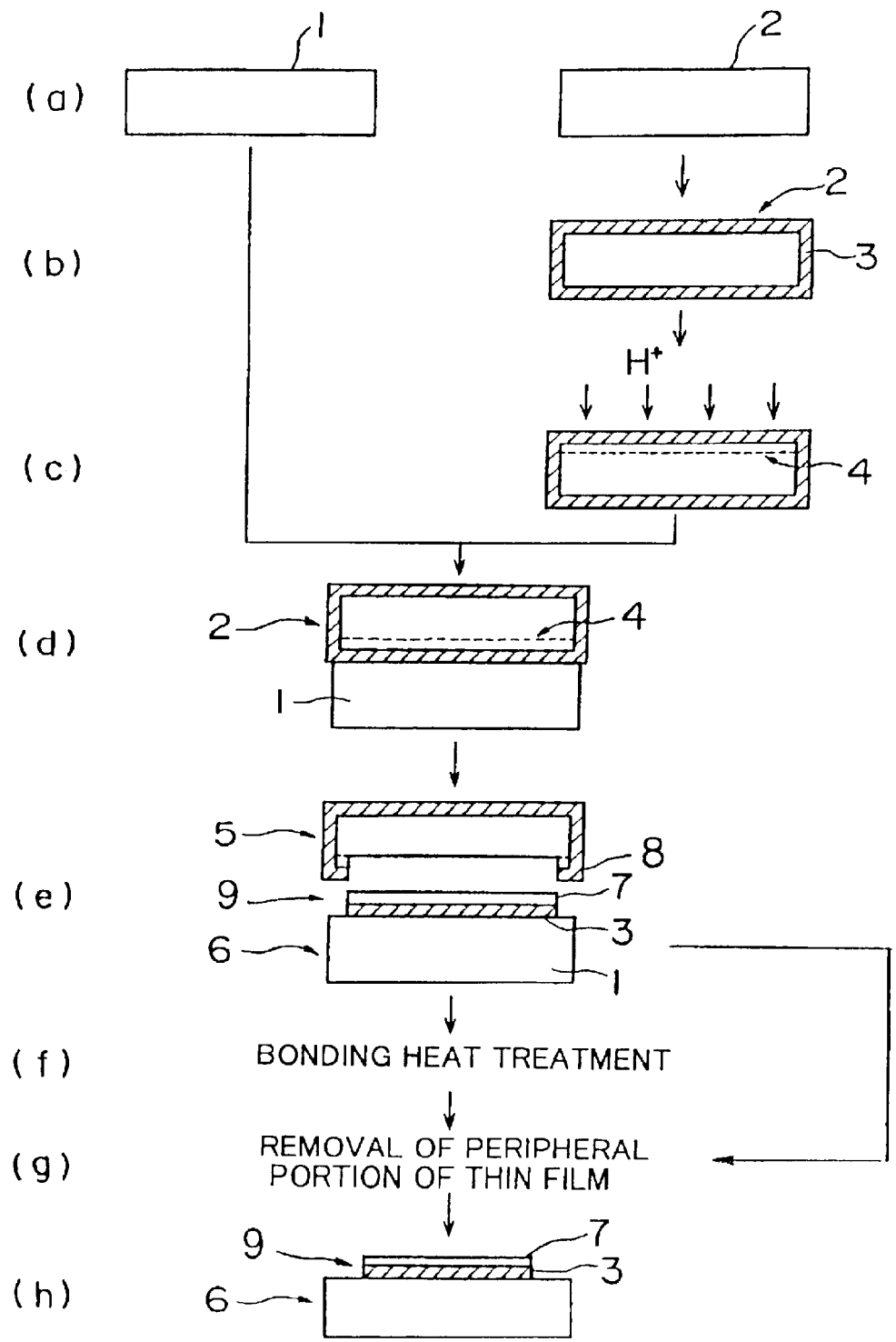
FIGS. 1(*a*) to (*h*) show a flow diagram of an exemplary process for producing an SOI wafer by the hydrogen ion delamination method according to the present invention.

FIG. 1 shows a flow diagram of an exemplary process for producing an SOI wafer, which is an embodiment of bonding wafer, by the hydrogen ion delamination method according to the present invention.

The present invention will be explained hereafter mainly as for a case where two of silicon wafers are bonded via an oxide film to produce an SOI wafer.

In the hydrogen ion delamination method shown in FIG. 1, two mirror-surface silicon wafers are prepared first in the step (a). That is, a base wafer 1 that serves as a substrate and a bond wafer 2 that serves as an SOI layer, which correspond to specifications of devices, are prepared.

Then, in the step (b), at least one of the wafers, the bond wafer 2 in this case, is subjected to thermal oxidation to form an oxide film 3 having a thickness of about 0.1–2.0 $\mu$m on its surface.

In the step (c), at least either hydrogen ions or rare gas ions, hydrogen ions in this case, are implanted into one surface of the bond wafer 2 on which surface the oxide film was formed to form a micro bubble layer (enclosed layer) 4 parallel to the surface in mean penetration depth of the ions. The ion implantation temperature is preferably 25–450° C.

The step (d) is a step of superimposing the base wafer 1 on the hydrogen ion implanted surface of the hydrogen ion implanted bond wafer 2 via an oxide film and bonding them. By contacting the surfaces of two of the wafers to each other in a clean atmosphere at an ordinary temperature, the wafers are adhered to each other without using an adhesive or the like.

The subsequent step (e) is a delamination step in which the wafers were delaminated at the enclosed layer 4 as a border to separate them into a delaminated wafer 5 and an SOI wafer 6 in which a SOI layer 7 is formed on the base wafer 1 via the oxide film 3. For example, if the wafers are subjected to a heat treatment at a temperature of about 500° C. or more under an inert gas atmosphere, the wafers are separated into the delaminated wafer 5 and the SOI wafer 6 (SOI layer 7+oxide film 3+base wafer 1) due to rearrangement of crystals and aggregation of bubbles. In this case, as also shown in FIG. 1, an unbonded portion 8 of peripheral portions of the oxide film 3 and the SOI layer 7 (a region of about 1 mm, or 2 mm at most, from the peripheral end of the base wafer 1) is left on the delaminated wafer 5, and only the portions bonded to the base wafer 1 remain on the base wafer 1 as a thin film 9 (SOI layer 7+oxide film 3).

The present invention is characterized in that a portion of the thin film 9 of which bonding strength with the base wafer 1 is not sufficient, that is, the peripheral portion of the SOI layer 7 or in addition the oxide film 3 in this case, is removed after the delamination step (e). However, since the bonding strength of the wafers obtained in the bonding step (d) and the delamination step (e) as it is would be weak for use in the device production process, the SOI wafer 6 is subjected to a heat treatment at a high temperature as a bonding heat treatment to obtain sufficient bonding strength before the removal. This heat treatment is preferably performed, for example, at 1050° C. to 1200° C. for 30 minutes to 2 hours under an inert gas atmosphere or an oxidizing gas atmosphere. Such a bonding heat treatment step (f) may be performed after the removal of peripheral portion of the thin film described later, or it may be omitted by increasing the heat treatment temperature of the delamination step (e).

After the bonding heat treatment step (f) is performed in advance as described above as required, the peripheral portion of the thin film 9 of which bonding strength to the base wafer 1 is insufficient, that is, the peripheral portions of the SOI layer 7 or in addition the oxide film 3 in this case, is removed in the step (g) for removing peripheral portion of thin film. The peripheral portion of insufficient bonding strength usually resides in a region of 1–5 mm from the peripheral end of the base wafer 1, and such a region is preferably removed. However, if an unnecessarily large region is removed, element fabrication area of the SOI layer surface will correspondingly decrease. Therefore, it is more preferred that the bonding strength of the thin film 9 (SOI layer 7 or SOI layer 7+oxide film 3) and the base wafer 1 should be made as high as possible for the whole wafers in the delamination step (e) or the bonding heat treatment step (f), so that the region to be removed in the thin film peripheral portion removing step (g) should become a region of 3 mm or less from the peripheral end of the base wafer 1.

A region of 1 mm or less from the peripheral end of the base wafer is an unbonded portion 8 as described above. Therefore, it is usually delaminated in the delamination step (e) with the delaminated wafer 5. However, even if the thin film remains also in this region after the delamination step (e), it can be removed in the thin film peripheral portion removing step (g) according to the present invention.

The peripheral portion of the thin film can be removed by etching the wafer with masking at least portions of the top surface other than the peripheral portion to be removed. For example, when only the SOI layer is removed for a region of 3 mm from the peripheral end of the base wafer, a masking tape is adhered to the SOI layer top surface so that only the peripheral portion to be removed should be exposed, and the wafer is immersed for a predetermined time in an acid etching solution of mixed acid (mixture of hydrofluoric acid and nitric acid) or the like, or a strongly alkaline etching solution such as those of potassium hydroxide and sodium hydroxide. By this treatment, the peripheral portion of the SOI layer not covered with the masking tape is etched and removed.

Further, when the oxide film should also be removed, the oxide film can be removed by using a longer immersion time or an etching solution containing strong acid showing strong action on the oxide film as a main component, since the oxide film is harder to be etched compared with the SOI layer.

The masking tape may consist of any material so long as it is resistant to the action of etching solution to be used. Specifically, those consisting of fluorocarbon resins, polyethylene and so forth can be used. Further, other than the masking with a masking tape, the etching can be performed by forming a coating film on the portions to be masked with wax of high corrosion-resistance, other organic polymer materials and the like. After the etching is performed with the masking to remove a peripheral portion of desired region as described above, the masking tape or the like used for the masking is stripped.

Instead of using a masking tape, it is also possible to coat photoresist on the top surface and expose it to light, so as to mask the top surface other than the peripheral portion. The photoresist is coated on an oxide film after the bonding heat treatment in an oxidizing atmosphere to mask the top surface other than the peripheral portion, and the oxide film of the peripheral portion is removed with hydrofluoric acid. By this treatment, the oxide film is left in the portion masked with the photoresist, and therefore it becomes possible to remove only the peripheral portion of the thin film by performing alkali etching using that oxide film as a mask.

The peripheral portion of the thin film can also be removed by etching a plurality of wafers stacked and held together so that at least the peripheral portions to be removed should be exposed, besides etching a wafer at least of which top surface other than the peripheral portion to be removed is masked as described above.

Figure 2:
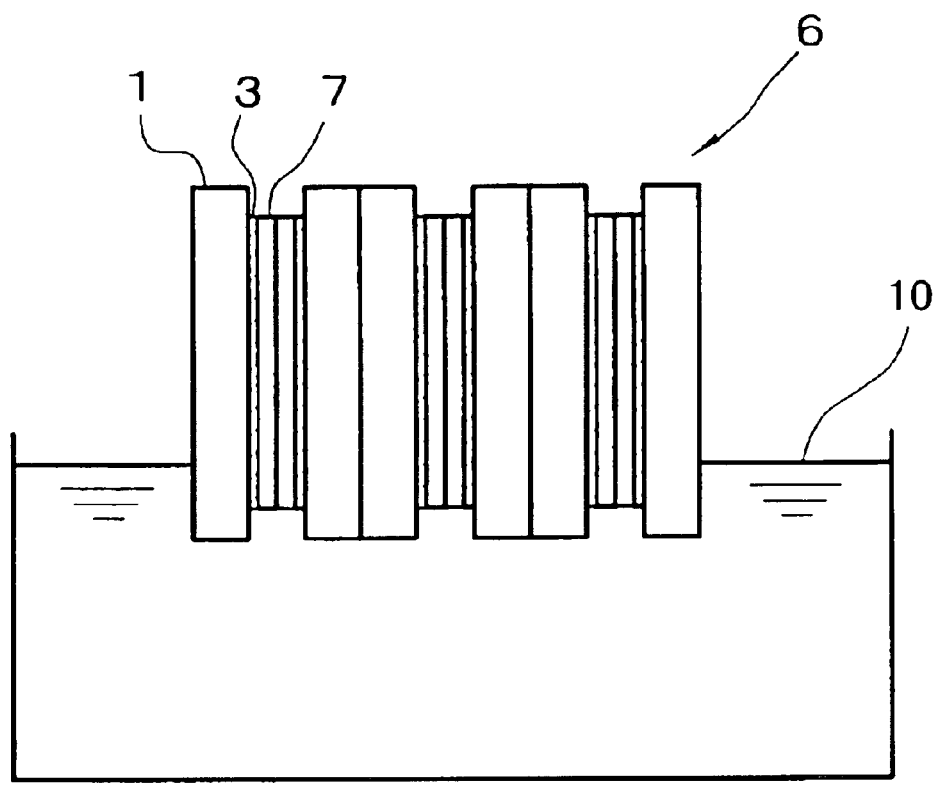
FIG. 2 is a schematic view illustrating an exemplary method for etching a peripheral portion of thin film of wafer according to the present invention.

For example, as shown in FIG. 2, two of SOI wafers 6 stacked so that their SOI layers 7 should face each other are prepared as one set, and a plurality of such sets are stacked by using a columnar jig (not shown in the figure) set at the both ends of the stacked wafer sets and subjected to etching in that stacked state. In this case, main surfaces of the SOI Layers 7 are contacted with each other and hence masked, while the side surfaces (peripheral portions) are exposed to the etching solution 10. Therefore, the SOI layers 7 as well as the oxide films 3 are etched from the side surfaces, and desired regions can be removed.

In the etching operation, the whole wafers may be immersed into an etching solution. However, the etching can surely be attained by exposing to an etching solution only the peripheral portions to be removed or such portions and neighboring portions. Therefore, as shown in FIG. 2, for example, the wafers 6 stacked by using a columnar jig can be rotated so that only the peripheral portions of the wafers 6 should always be in contact with the etching solution 10 by rotating the columnar jig (not shown in the figure).

When wafers stacked as described above are subjected to the etching, spacers may be placed between the wafers, and the aforementioned method of masking portions other than the peripheral portion to be removed by using a masking tape or the like may be used in combination to perform the etching. In such a case, the main surfaces of the SOI layers are surely masked, and they are not etched with etching solution penetrated from the gaps between the wafers.

By using the method described above, the region of peripheral portion showing insufficient bonding strength can be removed for the SOI layer, and besides the oxide film. However, when the base wafer is a silicon wafer, such a wafer may simultaneously be etched. If it must be prevented, portions of the base wafer to be exposed to the etching solution can be also coated beforehand with the aforementioned masking tape, wax or the like, and then subjected to the etching. Alternatively, if an SOI wafer is produced by using a wafer on which an oxide film is formed beforehand for the whole surface, the oxide film serves as a mask and hence the base wafer is prevented from being etched. However, if the bonding heat treatment (f) shown in FIG. 1 is performed, an oxide film can also be formed on a base wafer, and hence it is also possible to use this oxide film for the above purpose.

As for an SOI wafer, at least a peripheral portion of SOI layer of thin film formed on the base wafer can be removed by performing etching treatment as described above. Thus, an SOI wafer obtained in such a manner does not have peripheral portion of insufficient bonding strength and thus it does not substantially suffer from the problems of generation of particles due to delamination of thin film during subsequent cleaning step or device production step, generation of cracks in the SOI layer and so forth. Therefore, degradation of characteristics is markedly reduced and the yield is improved.

The peripheral portion of the thin film can also be removed by polishing only the peripheral portion.

FIGS. 3–7 are explanatory side views for the cases where the removal of peripheral portion is attained by polishing.

Figure 3:
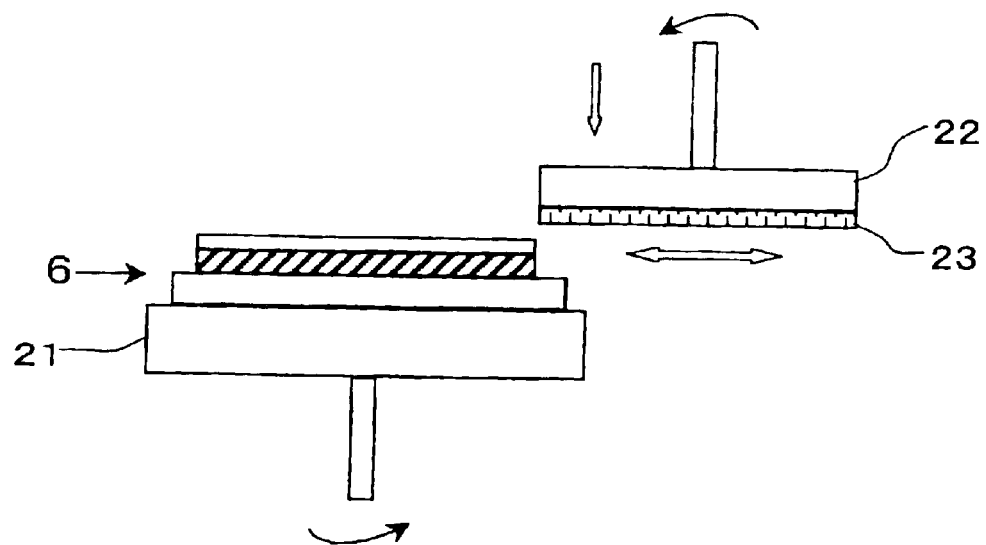
FIG. 3 is a schematic view illustrating an exemplary method for removing a peripheral portion of thin film of wafer by polishing according to the present invention.

FIG. 3 shows a method of polishing with polishing cloth 23 cut into a circular shape and pressed against a peripheral portion of SOI wafer from above. The SOI wafer 6 is held by a wafer holding table 21 by vacuum suction or the like, and the wafer holding table 21 is rotated by a non-illustrated motor or the like. A turn table 22 adhered with the polishing cloth 23 cut into a circular shape is rotated by a non-illustrated motor or the like around an axis perpendicular to the main surface of the SOI wafer 6 as a center. The end of the polishing cloth 23 is adjusted so that it should locate at a desired distance from the peripheral end of the SOI wafer 6, i.e., 1–5 mm from the peripheral end. Then, polishing is performed with the polishing cloth 23 pressed against the peripheral portion of the SOI wafer 6, while supplying a polishing agent containing colloidal silica and an alkali or an amine as main components to the peripheral portion of the wafer 6.

Figure 4:
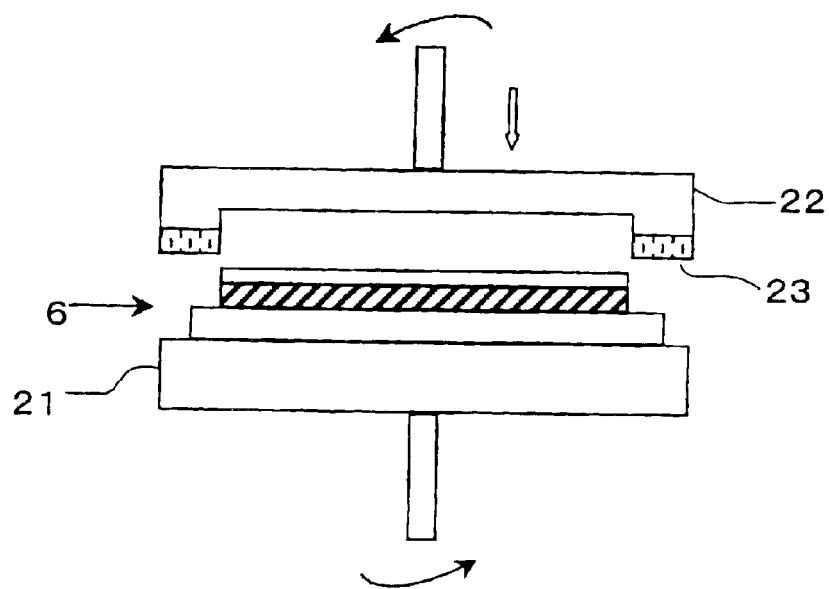
FIG. 4 is a schematic view illustrating another exemplary method for removing a peripheral portion of thin film of wafer by polishing according to the present invention.

FIG. 4 shows a polishing method, wherein a turn table 22 formed in a cup-like shape is adhered with a ring-like polishing cloth 23 having an inner periphery (inner diameter) at a distance of 1–5 mm from the peripheral end of the SOI wafer 6, that is, having an inner diameter smaller than the diameter of the base wafer by 2–10 mm and an outer diameter equal to the diameter of the base wafer or larger than it, and polishing is performed by pressing the polishing cloth from above against the peripheral portion of the SOI wafer 6 with aligning the rotation axis of the turn table 22 with that of the SOI wafer 6.

Figure 5:
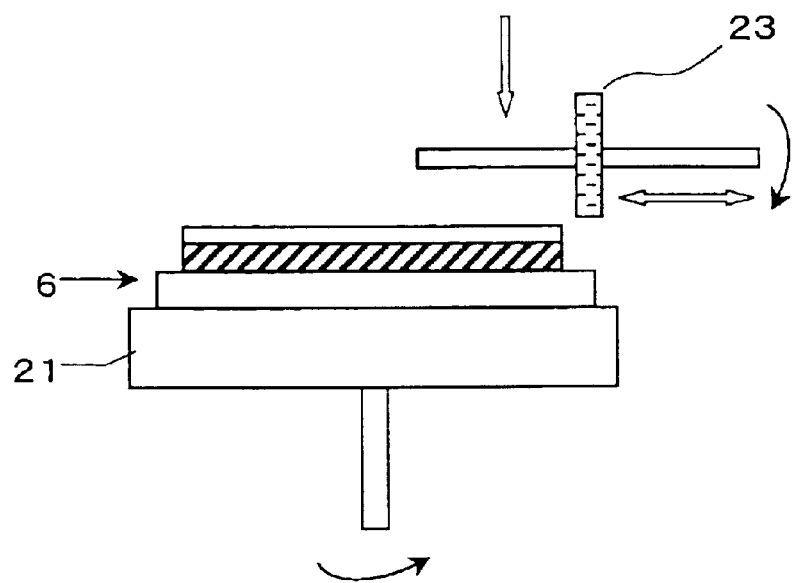
FIG. 5 is a schematic view illustrating another exemplary method for removing a peripheral portion of thin film of wafer by polishing according to the present invention.

FIG. 5 shows a polishing method, wherein polishing is performed by pressing an end portion of polishing cloth (buff) 23 cut into a circular shape or having a cylindrical shape with a small thickness against the peripheral portion of the SOI wafer 6 from above or side with rotation around an axis parallel to the main surface of the SOI wafer 6 as a center.

Figure 6:
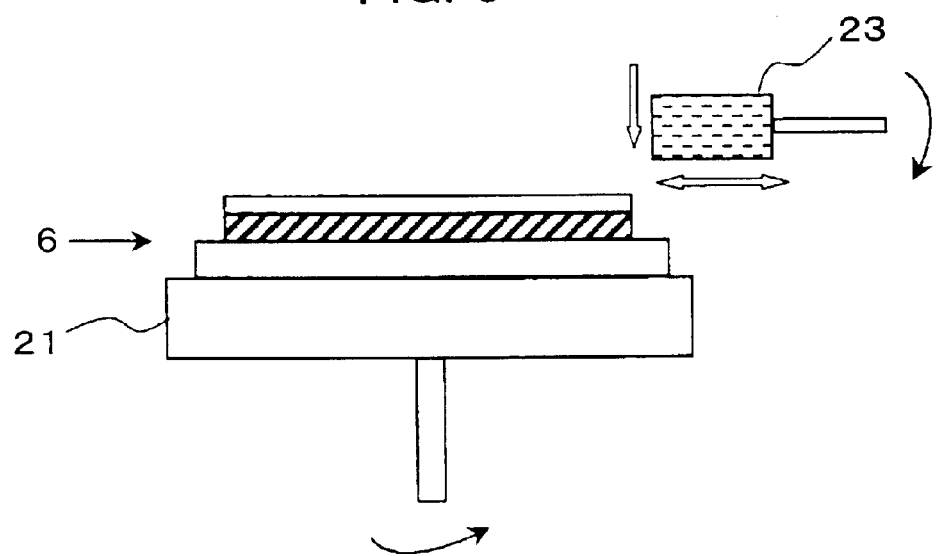
FIG. 6 is a schematic view illustrating another exemplary method for removing a peripheral portion of thin film of wafer by polishing according to the present invention.

FIG. 6 shows a polishing method, wherein polishing is performed by pressing polishing cloth (buff) 23 having a cylindrical shape against the peripheral portion of the SOI wafer 6 from above with rotation around an axis parallel to the main surface of the SOI wafer 6 as a center.

Figure 7:
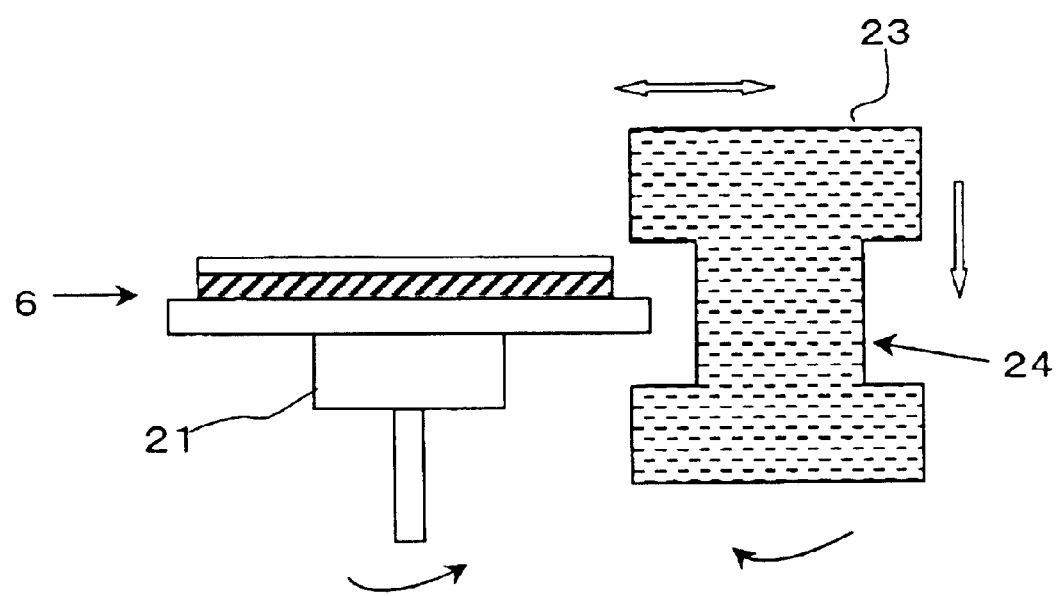
FIG. 7 is a schematic view illustrating another exemplary method for removing a peripheral portion of thin film of wafer by polishing according to the present invention.

FIG. 7 shows a polishing method, wherein polishing is performed with polishing cloth (buff) 23 having a cylindrical shape and a groove 24 of a desired depth on its side surface by pressing an upper surface of the groove 24 against the peripheral portion of the SOI wafer 6 with rotation of the cylindrical polishing cloth 23 around an axis perpendicular to the main surface of the SOI wafer 6 as a center.

The polishing cloth may consist of polyurethane foam, nonwoven fabric impregnated with polyurethane or the like, which is usually used for the polishing of silicon wafers.

As for the polishing, since the alkali or amine contained in the polishing agent has an action of etching silicon, the polishing agent is preferably supplied to only the peripheral portion as much as possible. In order to prevent the polishing agent from being brought into contact with portions other than the peripheral portion, it is also possible to supply pure water to the center of the wafer so that the pure water should cover the portions other than the peripheral portion with the aid of centrifugal force.

In the aforementioned embodiments, the present invention is explained for an SOI wafer that uses two of silicon wafers in which an SOI layer is formed on one of the silicon wafers (base wafer) via an oxide film. However, the present invention is not limited to it, and it can be applied to all bonding wafers produced by the hydrogen ion delamination method.

As described above, for example, in an SOI wafer consisting of a silicon wafer (bond wafer) implanted with ions and bonded to an insulator wafer (base wafer) having a different thermal expansion coefficient such as those of quartz, silicon carbide, alumina and so forth, a thin silicon layer (SOI layer) is formed on the insulator wafer. Also in such a wafer, a region showing insufficient bonding strength is present in a peripheral portion of the SOI layer after the delamination heat treatment. Therefore, by removing the peripheral portion, specifically, a region of 1–5 mm from the peripheral end of the base wafer, there can be obtained an SOI wafer in which the SOI layer is firmly bonded to the insulator wafer over the whole wafer.

Further, in a case of bonding wafer obtained by directly bonding silicon wafers to each other without an oxide film, a thin silicon layer is formed on the silicon wafer. Also in such a case, the region of insufficient bonding strength in the peripheral portion of the silicon layer can be removed according to the present invention to leave only the portion of the silicon layer firmly bonded to the silicon wafer for the whole wafer. Thus, generation of particles from the peripheral portion of the wafer, generation of cracks in SOI layer during subsequent cleaning step, device production step and so forth can be prevented.

For any of the aforementioned bonding wafers produced by the hydrogen ion delamination method, the peripheral portion of the thin layer formed on the base wafer can be removed by etching the bonding wafer with masking at least the top surface area other than the peripheral portion to be removed, or etching a plurality of bonding wafers stacked and held in one piece so that at least peripheral portions to be removed should be exposed as described above. Furthermore, the peripheral portion of the thin layer may be removed by polishing only the peripheral portion.

The present invention is not limited to the embodiments described above. The above-described embodiments are mere examples, and those having the substantially same structure as that described in the appended claims and providing the similar functions and advantages are included in the scope of the present invention.

What is claimed is:

1. A method for producing a bonding wafer by the hydrogen ion delamination method, comprising in order;

bonding a base wafer and a bond wafer having a micro bubble layer formed by gas ion implantation;

delaminating the base wafer and the bond wafer at the micro bubble layer as a border;

forming an oxide film by subjecting the base wafer having a thin film formed thereon to bonding heat treatment in an oxidizing atmosphere;

masking at least portions of a top surface other than a peripheral portion to be removed; and removing the peripheral portion of the thin film formed on the base wafer after the delamination step, wherein the removal of the peripheral portion of the thin film is attained by etching the wafer.

2. The production method according to claim 1, wherein the removal of the peripheral portion of the thin film is attained by removing a region of 1–5 mm from the peripheral end of the base wafer.

3. The production method according to claim 1, wherein the thin film has at least an SOI layer, and the removal of the peripheral portion of the thin film is attained by removing at least the SOI layer for a region of 1–5 mm from the peripheral end of the base wafer.

4. A method for producing a bonding wafer by the hydrogen ion delamination method comprising at least a step of bonding a base wafer and a bond wafer having a micro bubble layer formed by gas ion implantation and a step of delaminating them at the micro bubble layer as a border, wherein a peripheral portion of a thin film formed on the base wafer is removed after the delamination step, and the removal of the peripheral portion of the thin film is attained by holding together a plurality of wafers stacked so that at least the peripheral portions to be removed should be exposed, and etching them.

5. The production method according to claim 4, wherein the removal of the peripheral portion of the thin film is attained by removing a region of 1–5 mm from the peripheral end of the base wafer.

6. The production method according to claim 4 wherein the thin film has at least an SOI layer, and the removal of the peripheral portion of the thin film is attained by removing at least the SOI layer for a region of 1–5 mm from the peripheral end of the base wafer.

* * * * *